United States Patent [19]

Calviello

[11] Patent Number: 4,631,560

[45] Date of Patent: Dec. 23, 1986

[54] MOMS TUNNEL EMISSION TRANSISTOR

[75] Inventor: Joseph A. Calviello, Kings Park, N.Y.

[73] Assignee: Eaton Corporation, Cleveland, Ohio

[21] Appl. No.: 683,686

[22] Filed: Dec. 19, 1984

[51] Int. Cl.[4] .............................................. H01L 49/02

[52] U.S. Cl. ............................................ 357/6; 357/4; 357/15; 357/56

[58] Field of Search ............................ 357/6, 4, 15, 56

[56] References Cited

U.S. PATENT DOCUMENTS

| | | | |
|---|---|---|---|
| 3,356,864 | 12/1967 | Geoever | 357/6 X |
| 3,761,785 | 9/1973 | Pruniaux | 357/15 |
| 4,127,860 | 11/1978 | Beehtz | 357/15 |
| 4,137,543 | 1/1979 | Beneking | 357/15 |
| 4,212,022 | 7/1980 | Beneking | 357/15 X |
| 4,466,008 | 8/1984 | Beneking | 357/15 X |
| 4,499,656 | 2/1985 | Fabian | 357/15 |

*Primary Examiner*—Martin H. Edlow

*Attorney, Agent, or Firm*—Andrus, Sceales, Starke & Sawall

[57] ABSTRACT

An MOMS tunnel emission transistor is provided by a plurality of mesa stacked horizontal layers including at least one semiconductor layer (63) having an exposed edge (68) at a generally vertical side (67) of the mesa, such as the 111 plane. A first metal layer (66) has a generally vertical portion (72) extending along the side of the mesa and forming a schottky junction with the edge of the semiconductor layer. A generally vertical oxide layer (70) is on the first metal layer, and a second metal layer (71) is on the oxide. The MOMS tunnel emission transistor is formed by metal (71)—oxide (70)—metal (66)—semiconductor (63).

18 Claims, 16 Drawing Figures

MIM DIODE
2 - BAND MODEL
Vg = 4.5 eV
$V_{b1} = V_{b2} = 1.0$ eV
S = 10Å

MIM DIODE
2-BAND MODEL
Vg = 4.5 eV
$V_{b1} = V_{b2} = 1.0$ eV
S = 20Å

MIM DIODE
2-BAND MODEL
Vg = 4.5 eV
$V_{b1} = V_{b2} = 1.0$ eV
S = 30 Å

MIM JUNCTION
2-BAND INSULATOR
THEORY
Vg = 4.5V
$V_{b1} = 1.0$eV
$V_{b2} - V_{b1} = 1.0$eV

MOMS TUNNEL EMISSION TRANSISTOR

BACKGROUND

The invention relates to tunnel emission transistors, particularly for operation at submillimeter and optical wave frequencies.

Characteristics required for high performance tunnel emission transistors operating in the submillimeter and infrared wave frequencies include the fabrication of metal-oxide-metal tunnel diode junctions having pinhole-free high quality oxide, minimal parasitic shunt capacitance, minimal series inductance, minimal series resistance, minimal thermal resistance, minimal junction area and minimal junction barrier potential. In addition, these tunneling junctions must provide stable characteristics, and the structural configuration should be suitable for use in monolithic integrated circuits and arrays.

A tunnel emission transistor can be fabricated as an MOMS device comprising $metal_1$-oxide-$metal_2$-semiconductor. In the MOMS configuration, $metal_1$ is the emitter, the oxide is the emitter to base junction, $metal_2$ is the base, the base-collector junction is provided by a depletion layer in the semiconductor material formed by a schottky junction with $metal_2$, and the collector is the semiconductor.

The design and fabrication of MOMS tunnel emission transistors involves inherent difficulties and fundamental limits associated with the basic MOM junction. While some structures have been successfully fabricated and used as detectors and mixers at frequencies ranging from submillimeter to infrared frequencies with reasonably good performance, such structures have fundamental drawbacks limiting their practical usage in real world non-laboratory environments, and hence have not been commercially successful.

FIG. 1 shows a whisker-type MOM junction device 2 having a metal substrate 3, a dielectric oxide layer 4 on the substrate, and a metal whisker 5 making point contact 6 with oxide 4. The major disadvantage of a whisker-type structure such as 2 is the instability of the junction 6 due to thermal and pressure effects, rendering such structure a laboratory curiosity, not a practical device. Furthermore, even if the stability problem could be overcome, such structure would have limited use because of its incompatability with present advanced system design integrated circuits and arrays.

To overcome the problems inherent in point contact devices, attempts have been made to fabricate MOM tunnel diode devices in planar structures. FIG. 2 shows a side cross sectional view of such a device 7 comprising metal 8, oxide 9 and metal 10 positioned essentially in planar layers one above the other. FIG. 3 is a side cross sectional view of a device 11 comprising metal 12, masking oxide 13, junction oxide 14 and metal 15. FIG. 4 is a top plan view of the structure of FIG. 3 showing the circular configuration of the junction at 16. The devices of FIGS. 2–4 attempt to produce the equivalent of a point contact device such as 2 but using planar technology, even though the small dimensions of the point contact junction 6 cannot be achieved in the designs of FIGS. 2–4. The designs of FIGS. 2–4 further suffer high series resistance, high parasitic shunt capacitance, large junction areas on the order of $10^{-7}cm^2$ to $10^{-8}cm^2$, and undesirably high skin resistance. Operating efficiency is severely limited at frequencies on the order of 1,000 gigahertz.

There are additional processing related problems which prevent achieving a satisfactory planar device. Planar technology prevents defining an extremely small junction area or producing a metal layer with a high quality uniform thickness free of impurities and pinholes or a metal surface that is extremely smooth and without defects. Processing techniques generally use either a wet chemical etches or a pure sputtering etch. Both of these techniques lead to the formation of poor surface morphology which is not conducive to obtaining a thin uniform oxide necessary for the fabrication of high performance devices. Conventional optical lithography combined with either of the above etching processes cannot prevent the required small junction area in the $10^{-8}$ to $10^{-10}cm^2$ range. Even if it were possible to define a linewidth of 1 micron, it would still be difficult to fabricate the desired junction area reliably using the above noted processing techniques. In order to realize a 1 micron linewidth, the thickness of the metal would have to be limited to about 1,000 angstroms, thus increasing the resistivity of the leads to an unacceptably high value.

The ability to produce a very small junction area in a planar diode structure, FIGS. 2–4, is restricted by the dielectric layers such as 13. Layer 13 must be very thin in order to photolithographically define the junction. If the dielectric layer is too thick, the junction would not be well defined because the etching may not proceed uniformly through the thick dielectric layer. Since the dielectric layer 13 has to be thin, the region where metals 12 and 15 overlap will contribute an excessive amount of parasitic shunt capacitance. This capacitance will increase the diode's RC time constant, and thus lower the useful operating range of the diode to frequencies well below 1,000 gigahertz.

Another difficulty inherent in prior MOM junctions is that the required very thin oxide is derived from pure elements, for example tungsten, aluminum, etc., that result in the formation of the respective oxides such as $WO_3$ $Al_2O_3$, etc., having high dielectric constants and high losses. Using these dielectrics results in high junction capacitance. Furthermore, the thickness and purity of such dielectrics is not accurately controllable or repeatable because of the thermal, air ambient, or chemical exposure type oxidation techniques.

FIG. 5 shows a prior MOMS tunnel emission transistor 17 having a silicon semiconductor substrate 18 with a gold layer 19 on its upper surface and a silicon dioxide film 20 on layer 19 engaged by bulged mercury emitter electrode 21. Collector electrode 22 contacts semiconductor layer 18. The MOMS transistor is formed by metal 21- oxide 20 - metal 19- semiconductor 18.

THEORY

Theoretical Estimate Of Thermal Effect And Degree of Asymmetry In MOM Junctions An understanding of the properties of MOM tunnel diode junctions is necessary in order to establish design parameters needed for the fabrication of high performance symmetrical and asymmetrical junctions operating in the field assisted mode and with negligible thermal component. The following study concentrates on tantalum and $Ta_2O_5$, though it is applicable to other metallurgy including molybdenum, molybdenum/silicon, tungsten, tungsten/silicon, etc.

The voltage-current characteristics are calculated for symmetrical and asymmetrical junctions as a function of oxide thickness and barrier potential. These show that the fabrication of high performance tunnel effect transistors requires oxides in the 10 angstrom range in the emitter region and near 20 to 30 angstroms in the collector region as compared to much thicker oxide used in prior tunnel effect transistors.

Sommerfeld and Bethe, Hand Buch der Physik, von Geiger and Scheel, Julius Springer-verlog, Berlin, 1933, Vol. 24/2, p. 450, made a theoretical study of tunneling effect. It was shown that if two metal electrodes are separated by a very thin insulating film, current can flow between the two metal electrodes via tunneling. Simmons, Journal of Applied Physics, Vol. 34, No. 6, June 1963, p. 1793, extended Sommerfeld's theory to include image forces and derived a generalized formula for the electric tunnel effect between electrodes forming a symmetrical junction and between dissimilar electrodes forming an asymmetrical junction.

A rigorous analysis of the MOM tunnel diode requires an exact solution of Schroedinger's wave equation in one dimension for a variable potential field. To simplify analysis, the following assumptions are typically followed in theoretical analysis: WKB Wentzel-Krammers-Brillouin, approximation is valid; and metal electrodes can be treated as free electrons in a box, thus ignoring their detailed energy band structure; and a parabolic energy band exists in the insulator. Simmons calculated the current-voltage, I-V, characteristic of an MOM junction using a one band model and the effective mass approximation. This approximation becomes somewhat inaccurate whenever carriers at energy levels near the center of the insulator band gap contribute to the junction current.

In the one band model, the energy band structure of the insulator is represented by a conduction band and a valence band separated by an infinite band gap, hence a one band model. As long as the band gap in the insulator is much greater than the surface barrier voltage, the use of a one band model is sufficient.

For an insulator such as $Ta_2O_5$ with a band gap near 4 to 4.5 electron volts, the use of a two band model will give better results when the barrier voltages are about 2 electron volts or greater. In addition, the two band model renders more accurate analysis and predicts the I-V characteristics of asymmetrical junctions as well as their behavior as a function of temperature. In the two band model, the presence of the valence band affects tunneling in two ways: it affords a parallel path for the current to flow via hole conduction; and it results in reduced wave attenuation in the potential barriers.

Using the two band model, the I-V characteristics are calculated for a symmetrical Ta-$Ta_2O_5$-Ta MOM tunnel diode as a function of temperature and the results are plotted in FIGS. 6–8. In FIG. 6, ordinate 23 represents current density in amperes per square centimeter, and abscissa 24 represents voltage in volts. First plot 25 in solid line represents the I-V characteristic at a temperature of 0° K. Second plot 26 in long dashed line represents the I-V characteristic at 473° K. Third plot 27 in short dashed line represents the I-V characteristic at 673° K. The band gap $V_g$ is 4.5 electron volts. Each barrier potential $V_{b1}$ and $V_{b2}$ is 1.0 electron volt. The oxide thickness S is 10 angstroms. FIG. 7 shows a similar graph with plots 28–30, and the same parameters except that the insulator thickness S is increased to 20 angstroms. FIG. 8 shows another similar graph with plots 31–33, and the same parameters except that the insulator thickness S is increased to 30 angstroms.

FIGS. 6–8 show that tunneling theory predicts that the I-V characteristics are temperature dependent, and that the dependence on temperature decreases as the oxide insulator thickness decreases to about 10 angstroms or thinner. Thus, for an MOM tunnel diode with an oxide thickness in the 5 to 10 angstrom range, the I-V characteristic should be almost temperature independent.

Using the above theory, the I-V characteristic of an asymmetrical Ta-$Ta_2O_5$-Ta MOM tunnel diode as a function of oxide insulator thickness is also calculated for two values of the first metal barrier potential $V_{b1}=1.0$ electron volt, FIG. 9, and $V_{b2}=0.5$ electron volt, FIG. 10, where $V_{b2}-V_{b1}=1$ electron volt, where $V_{b1}$ and $V_{b2}$ are the barrier potentials at the first and second metal oxide interfaces respectively. The result is shown in FIGS. 9 and 10.

In FIG. 9, ordinate 34 represents current density in amperes per square centimeter, and abscissa 35 represents the junction voltage in volts. Solid plots 36–39 represent the I-V characteristic at a reverse voltage for various oxide insultator thicknesses. Dashed plots 40–43 represent the I-V characteristic at a forward voltage for the various oxide insulator thicknesses. The oxide thicknesses range from 40 angstroms down to 10 angstroms in 10 angstrom steps for respective plots 36–39 and 40–43. The same format is followed in FIG. 10 for respective reverse voltage plots 44–47 and forward voltage plots 48–51. FIGS. 9 and 10 show that the magnitude of the asymmetry in the I-V characteristic is a function of oxide insulator thickness and barrier potential.

The structural configuration of the tunnel diode in FIG. 11, disclosed in my U.S. Pat. No. 4,549,194 issued Oct. 22, 1985, was designed and fabricated using the results of the above analysis. A substrate 52 has an insulating layer 53 and a metal layer 54. Peninsula-like projection 55 of metal layer 54 is oxidized at its tip 56. A second metal layer 57 contacts tip 56 and is covered by a lead 58. The MOM tunnel diode is formed by metal 54—oxide 56—metal 57. The same type of structure may be provided at second lead 59.

The successful development of structure such as that in FIG. 11 requires the MOM tunnel diode junction to preferably have the following characteristics: an oxide thickness in the 5 to 15 angstrom range for symmetrical structures, and greater than 15 angstroms for asymmetrical junctions; low barrier potential less than 1 electron volt; junction area ranging between $10^{-10}$ to $10^{-11}cm^2$; negligible shunt capacitance, less than $10^{-17}$ farad; a diode that is structurally stable and almost invariant to local oscillator pump power; negligible dependence on temperature; negligible skin effect resistance contribution; junction fully exposed to input radiation, for example the absence of dielectric covering the junction for the purpose of either passivation or any other reason such as structural configuration, which dielectric may otherwise absorb at the operating frequency. Such a structure has been successfully fabricated and has achieved heterodyne detection at 10.6 micron wavelength, at barrier potential of 0.4 to 0.5 electron volt.

In the MOM tunnel diode structure of FIG. 11, the required characteristics form an MOM tunnel diode junction operating at infrared frequencies, which include negligible parasitic shunt capacitance of $10^{-5}$pf or less, a submicron junction area of $10^{-10}cm^2$ and very low series resistance, are achieved by means of a structural configuration and geometry which permits the definition of submicron linewidths. The structure utilizes planar technology, however an extremely small peripheral junction is formed, rather than the usual large planar junction. In addition, the leads are formed in a semi-arch configuration to function as a monopole antenna element suspended in air, enhancing the coupling efficiency to the device. Lead resistance normally incurred in the metal layer is reduced by providing a relatively thick overlayer of gold which may range from 1,000 angstroms to 5,000 angstroms.

In the processing tecnnique for the structure and geometry of FIG. 11, reactive plasma etching is used to define the linewidths and also to etch the surface of the junction prior to the formation of the oxide layer. A peninsula-like projection used to form the submicron peripheral junction is defined by reactive plasma etching, resulting in a clean smooth peripheral surface edge, an essential preparatory step in achieving a uniformly thin and pinhole-free metal oxide layer at the junction. The formation of such high quality oxide at the junction is important in the tunneling of carriers and is therefore significant in producing a reliable and high performance MOM tunnel diode.

Using the structure o FIG. 11 and the noted processing, excellent performance, reliability and repeatability has been achieved at infrared frequencies in the wavelength range of 8 to 12 microns, and has responded to optical frequencies via field assisted tunneling. It has been found tnat the measured direct detection signals in other planar structures are fully attributed to thermal effect, not direct detection via field assisted tunneling. The thermal assisted signals are predicted theoretically, as noted above.

The reasons for failure of prior MOM tunnel devices to perform satisfactorily in the heterodyne mixing or field assisted mode are: junction areas which are too large, and the low current density resulting therefrom; excessively high series resistance at optical frequency; lossy metallurgy, including high base resistance metallurgy; excessive thermal assisted tunneling which lowers tunneling probability for field assisted tunneling; poor oxide quality, including high dielectric constant, and losses in the oxide; junctions having high barrier potential near or above two electron volts; structural geometry contributing to large parasitics, including high parasitic shunt capacitance; and the use of symmetric junctions for the emitter-base and the base-collector which resulted in essentially similar impedance for the input and output and high leakage of electrons from base to collector as well as low current transfer rario of collector current to emitter current.

Tunnel Effect Transistor Performance

Assuming a one band model as shown in FIG. 12 where the band gap $E_g$ is not greater than the barrier potential $\Phi$ and the applied voltage is greater than $\Phi$, the current density J, not considering image forces, in an MOM junction is approximated by (A. G. Chynoweth, Progr. in Semiconductors 4, 97 (1959):

$$J = J_o\left(\frac{E}{E_o}\right)^2 \exp\left(\frac{-E_o}{E}\right)$$

$$\text{where } J_o = \frac{2q\Phi^2 m^*}{9\hbar\pi^2}$$

-continued $$E_0 = \frac{4\Phi^{3/2}(2m^*)^{1/2}}{3\hbar q}$$

$m^*$ = effective electron mass q = electron charge $\hbar = h/2\pi$ h = Planck's constant $\Phi$ = metal-insulator work function A simplified band diagram of a tunnel effect transistor is shown in FIG. 13. An MOMS device is formed by the emitter-oxide-base-semiconductor. Electrons tunneling through the thin base region find themselves in the conduction band of the schottky junction to the semicondcutor and, assuming the semiconductor collector is positively biased, will be accelerated to the right and hence collected. Tunnel effect transistors can be characterized similarly to a conventional bipolar transistor in electrical schematics. In a common base connection, power gain can be obtained as a result of the impedance transformation between incremental input and output impedance.

Frequency Limitations Since tunneling occurs within an extremely short time, the operatinq frequency is limited by the input capacitance and associated resistance. A fiqure of merit M can be defined as (C. A. Mead "Operation of Tunnel-Emission Devices" JAP 32 No. 4, 646 (1964)):

$$M = 1/RC$$

where R is the incremental base input resistance defined by $$R = (1/dI/dV)$$

and the input capacitance C (Emitter base) is given by $$C = (eA/D)$$

where D is the oxide thickness, A is the junction area, and e is the oxide dielectric constant. Thus the figure of merit M, using the above relation is given by $$M = (JE_o/eE^2)$$

Using the MOM tunnel diode geometry of FIG. 11, it is possible to achieve current densities J in the range 4 to $6\times10^6$ Ampere/cm$^2$ range at field values in the 1.2 to $1.6\times10^7$ volts/cm range. Tne calculated figure of merit M approaches $10^{12}$ cycles per second. Thus, using a properly design MOM tunnel diode junction it is possible to realize a figure of merit needed to efficiently operate a tunnel efrect transistor in the optical region. In addition, the above theory indicates the need to fabricate devices having very small junction area in order to achieve the highest current density possible, and oxides having very low dielectric constant and free of impurities to achieve these high field values.

SUMMARY

It is an object of the present invention to provide a tunnel effect transisror which overcomes the fabrication and yield difficulties encountered with prior planar and whisker-type tunnel effect transistor devices.

It is a further object of the invention to provide a high performance reliable tunnel effect transistor operating in the submillimeter to optical wave frequency range, including preferred characteristics for efficient operation in such range, including negligible parasitic base resistance, low lead inductance and resistance, low shunt capacitance, small emitter junction area in the $10^{-10}cm^2$ range or below, high purity oxides with refractive indices in the 1.55 to 1.7 range, low junction barrier potential below 1 electron volt at the emitter and 0.5 electron volt at the collector.

These are achieved by a combination of novel structural geometry and in the preferred embodiment, advanced dry etch plasma processing, new metallurgy and the use of gallium arsenide verv high doped N+ epitaxial layers with carrier concentration in the 1 to $4\times10^{19}cm^{-3}$ range grown by molecular beam epitaxy.

The structure utilizes planar technology, and an extremely small and stable peripheral junction is formed, rather than the usual large planar junction or the unstable whisker-type junction.

Leads are formed in a semi-arch configuration, the length of which is dictated by the operating frequency, to function as monopole antenna elements for enhancing the coupling of incoming radiation to the device junction. Load resistance, normally incurred in the second metal layer of prior planar devices, is reduced by providing a relatively thick overlayer of gold which may range from 1,000 to 5,000 angstroms in the preferred species.

The base metal contact resistance is drastically reduced and essentially eliminated by providing a low resistance gold merallurgical contact to the base metal via bridging tecnniques and within 1,000 angstroms from the emitter junction.

The barrier potential at the emitter base junction is below 1 electron volt and is achieved by using a refractory metal or refractory silicon alloy metallurgy such as tantalum, tantalum/silicon, molybdenum, molybdenum/silicon, tungsten or tungsten/silicon. The addition of silicon allows for the formation of high quality oxides having low loss and low dielectric constant.

The metallurgy and marerials for the emitter, base and collector in the MOMS structure are chosen to give a respective barrier height satisfying the relation $V_c<V_e$, where $V_c$ is the base to collector voltage and $V_e$ is the emitter to base voltage, and where the oxide is either native or reactively deposited using tantalum or tantalum/silicon merallurgy for forming the emitter oxide (0.7 electron volt$\leqq V_e \leqq$1 electron volt) and schottky metal and semiconductor to form the collector junction (0.4 electron volt$\leqq V_c \leqq$0.6 electron volt). The percent of silicon can be varied (5–40%) to form oxide with desired quality.

A table of base metals having hot electron/electron, electron/phonon mean free path in excess of 400 angstroms for electron/electron and electron/phonon are selected as shown in Table I below, where MFP is the hot electron mean free path in angstroms.

TABLE I

Hot Electron Mean Free Path (MFP) In Some Metals Near 1 eV Above Fermi Level

| Metals | Excess energy(ev) | MFP(A°) |
|---|---|---|
| Pd | 1 | e-e ≈ 650, e-ph ≈ 100 |
| Au | 1 | 700 (average) |
| | | e-e ≈ 1200, e-ph ≈ 400 |
| Ag | 1 | e-e, e-ph ≈ 570 |
| | 1.1 | 450 |

e-e is electron-electron collison, and e-ph is electron-phonon collision. In addition, design parameters for tunnel effect transistor devices which include oxide thicknesses and barrier potential for the emitter-base and base-collector junction are shown in Table II below.

TABLE II

Desirable Design Parameters For Optical Transistors

| Oxide Thickness (A°) | Barrier potential (ev) |
|---|---|
| Emitter/Base $d_{EB} \approx 15$ | $0.7 \leqq \Phi_e \leqq 1.0$ |
| Base/Collector $20 < d_{BC} < 30$ | $.5 \leqq \Phi_c \leqq 0.7$ |

$d_{EB}$ is the oxide thickness between emitter and base. $d_{BC}$ is the oxide thickness between base and collector. $\Phi_E$ is the barrier potential of the emitter. $\Phi_c$ is the barrier potential of the collector.

In the MOMS structure, $metal_1$ and $metal_2$ form the emitter and base, respectively, and in the preferred embodiment base $metal_2$ forms a schottky contact to the semiconductor and the semiconductor is the collector formed by an N+ highly highly doped gallium arsenide layer whose carrier concentration and biasing conditions are chosen to give the desired depletion layer thickness in order to achieve desired input and output impedance. Using a highly doped N+ gallium arsenide layer in combination with the structural geometry of the present invention will result in essentially zero resistance contribution in the collector electrode. The N+ layer can be epitaxially grown on a substrate for multidevice and integration capability, and also to achieve low parasitic capacitance contribution.

In the preferred processing techniques, reactive plasma etching is used to define micron and submicron linewidth and spacing, and also to etch the surfaces to be oxidized prior to the formation of the oxide layers. A submicron peripheral junction is defined by the reactive plasma etching, resulting in a clean smooth peripheral surface edge, a significant preparatory step in achieving a uniformly thin and pinhole-free oxide layer to the junction. A high quality oxide at the junction is formed by reactive deposition or etching and is a significant parameter directly affecting tunneling of carriers, and is thus significant in producing a reliable and high performance tunnel effect transistor. In addition, the cleaning, oxidation and metallization are performed in situ in an extremely clean and high vacuum sputtering system. The smooth and clean etched surface achieved by reactive ion etching is also important for the formation of a low resistance and pinhole-free base metal layer whose thickness will be in the 100 to 300 angstrom range.

The structural design and geometry of the present invention enables the above noted features and advantages in a particularly simple and effective manner.

DETAILED DESCRIPTION

As noted above in detail, the reasons for prior tunnel effect transistors failing to perform satisfactorily as optical amplifiers include: too large a junction area; excessively high series resistance (lead and base resistance) at DC and most notably at submillimeter and optical wave frequency (skin effect); junction designs and fabrications resulting in large thermal contribution, and consequently in a reduction of the tunneling probability for field emission generation; poor oxide quality; improper barrier potential and oxide thickness for the emitter and collector; and high parasitic shunt capacitance and series lead inductance.

Figure 1:
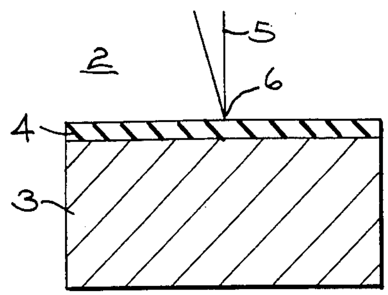
FIG. 1 is a schematic illustration of a prior art point contact tunnel diode.
Figure 2:
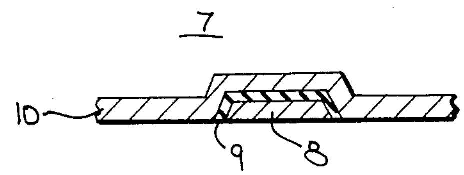
FIG. 2 is a schematic cross sectional view of a prior art planar tunnel diode.
Figure 3:
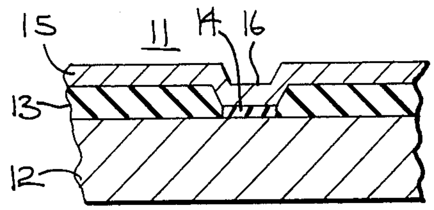
FIG. 3 is a schematic cross sectional view of another prior art planar tunnel diode having a circular junction configuration.
Figure 4:
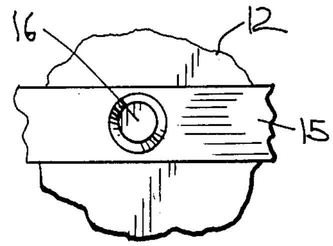
FIG. 4 is a schematic top plan view of the device of FIG. 3.
Figure 5:
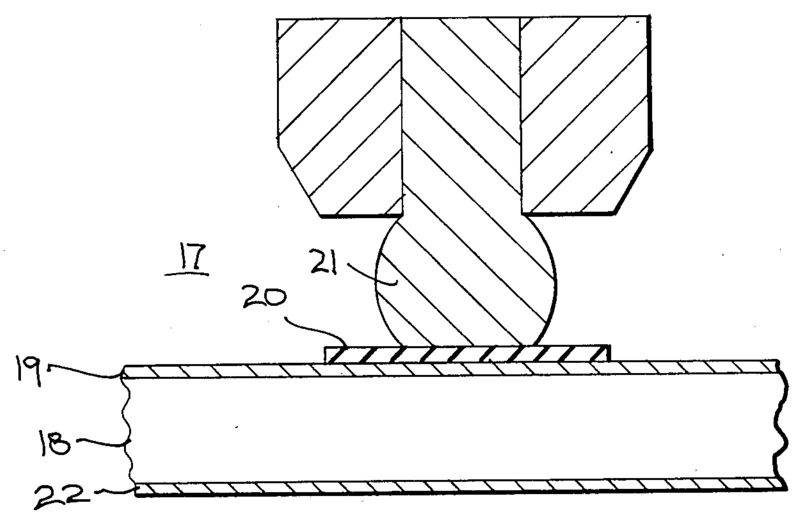
FIG. 5 is a schematic cross sectional view of a prior art MOMS tunnel effect transistor.
Figure 6:
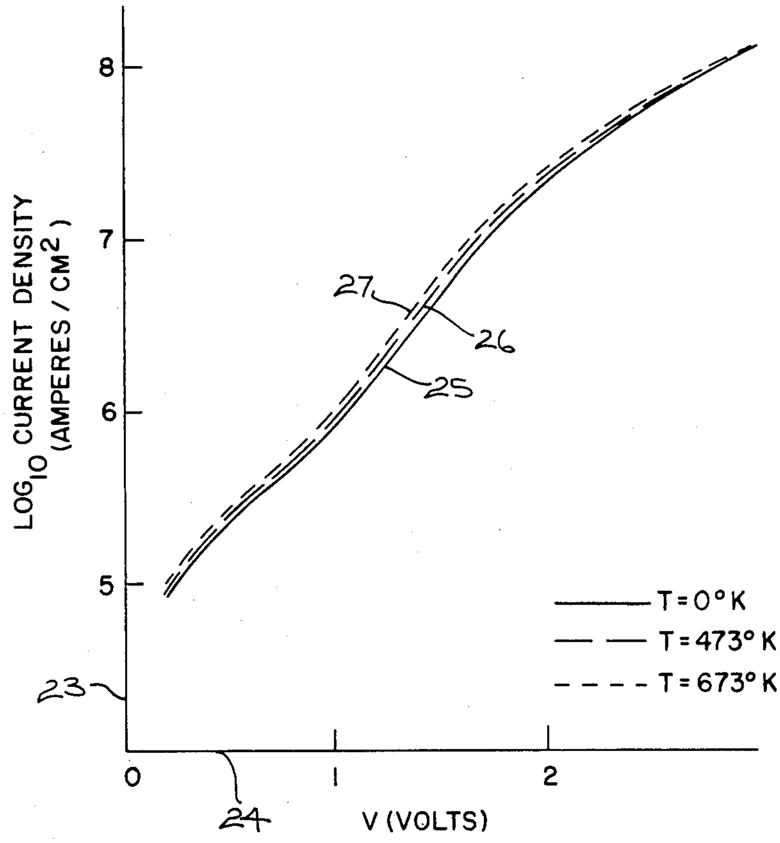
FIG. 6 is a graph showing the current-voltage characteristic of a symmetrical tunnel diode with oxide thickness of 10 angstroms.
Figure 7:
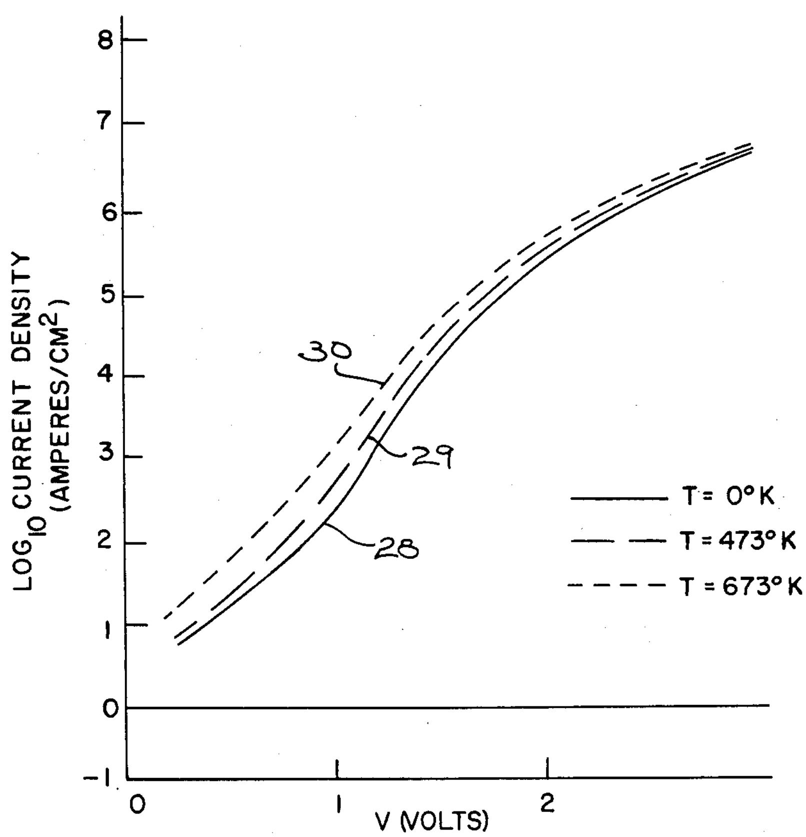
FIG. 7 is a graph showing the current-voltage characteristic of a symmetrical tunnel diode with oxide thickness of 20 angstroms.
Figure 8:
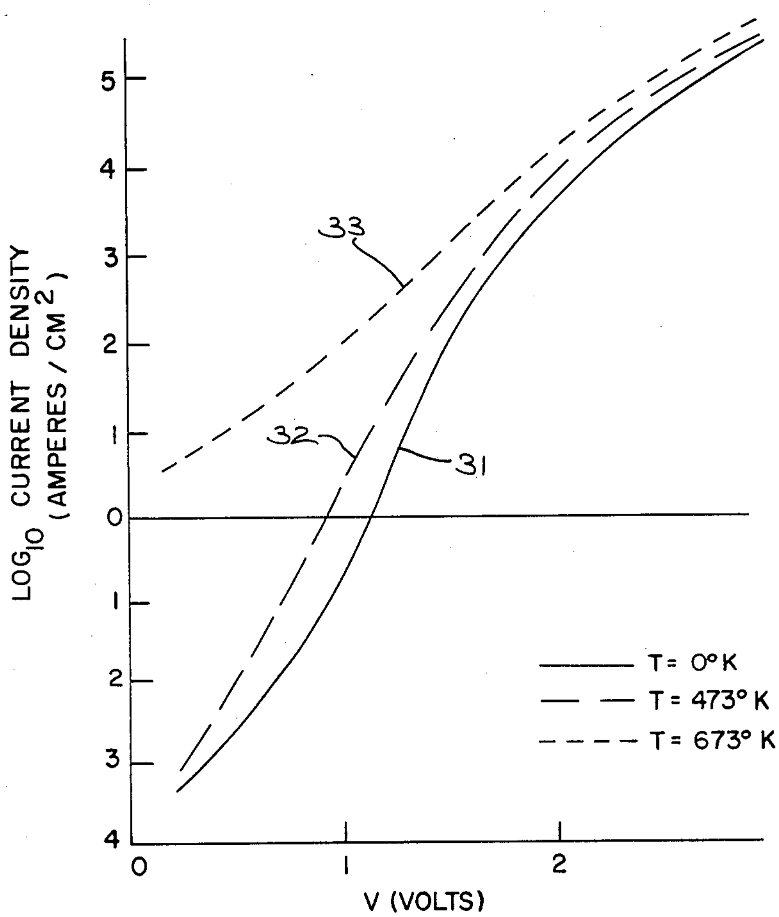
FIG. 8 is a graph showing the current-voltage characteristic of a symmetrical tunnel diode with oxide thickness of 30 angstroms.
Figure 9:
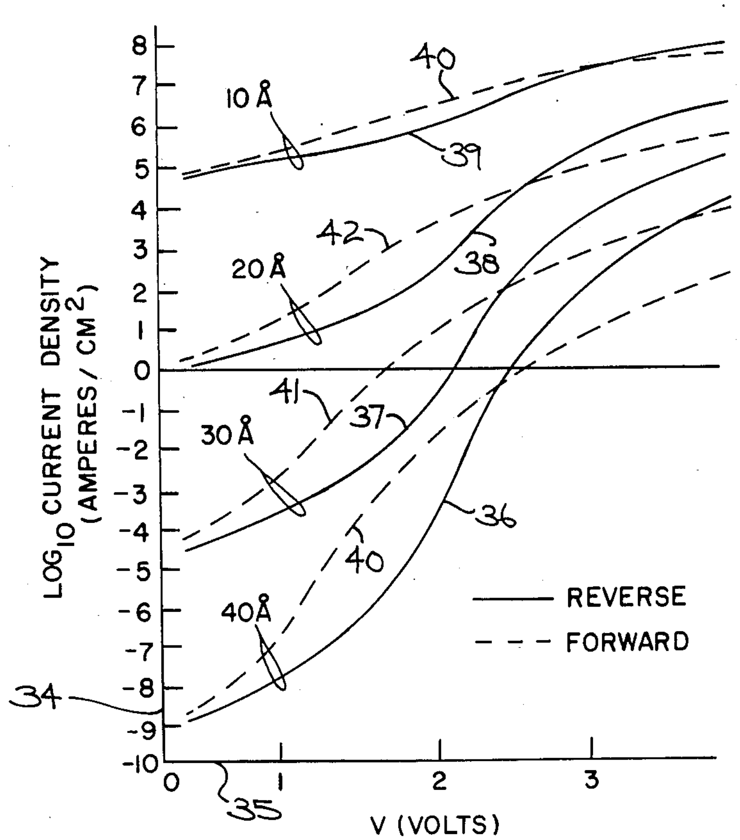
FIG. 9 is graph showing the current-voltage characteristic of an asymmetrical tunnel diode with a barrier potential of 1.0 electron volt.
Figure 10:
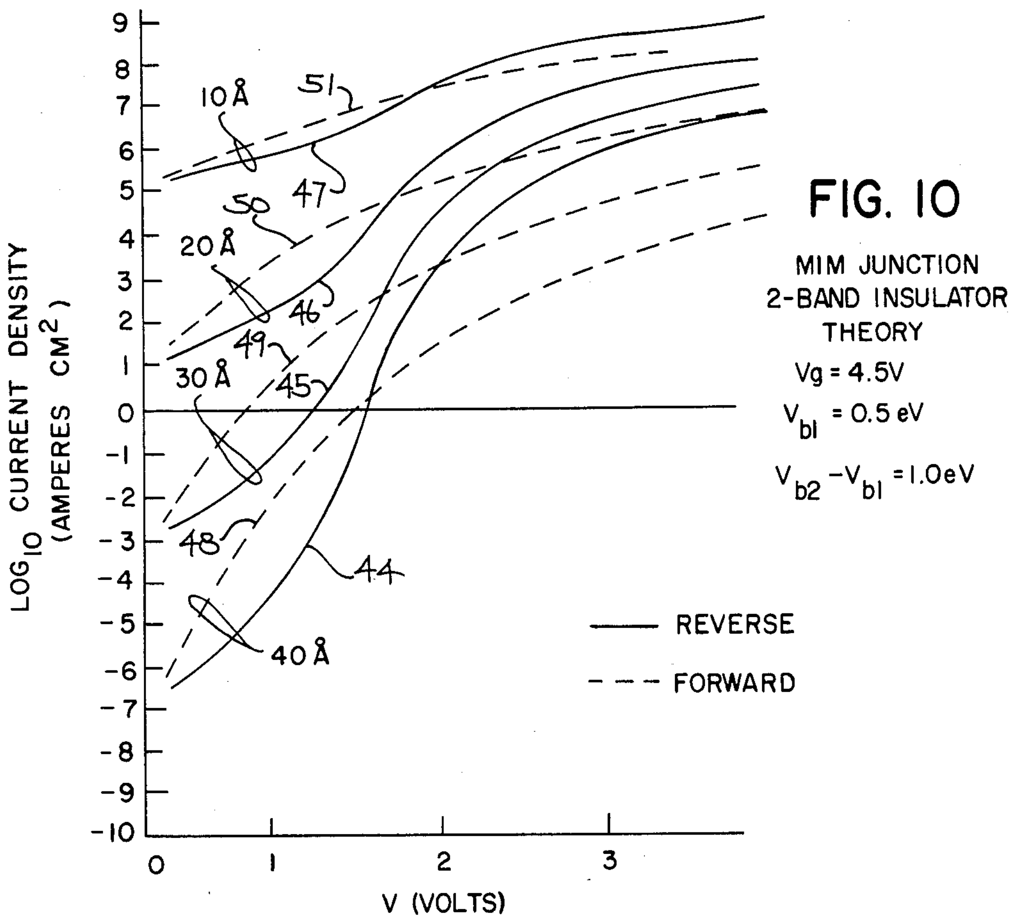
FIG. 10 is a graph showing the current-voltage characteristic of an asymmetrical tunnel diode with a barrier potential of 0.5 electron volt.
Figure 11:
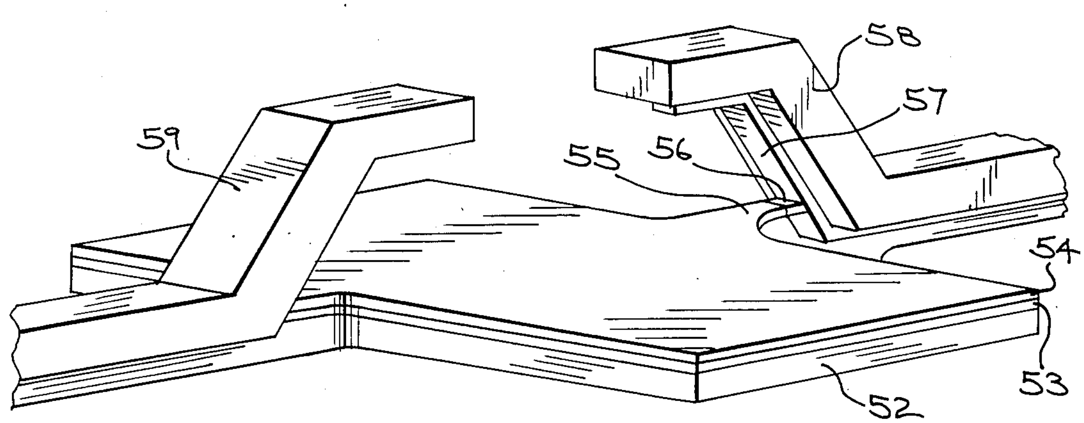
FIG. 11 is a schematic perspective view of my MOM tunnel diode structure in my noted U.S. Pat. No. 4,549,194 issued Oct. 22, 1985.
Figure 14:
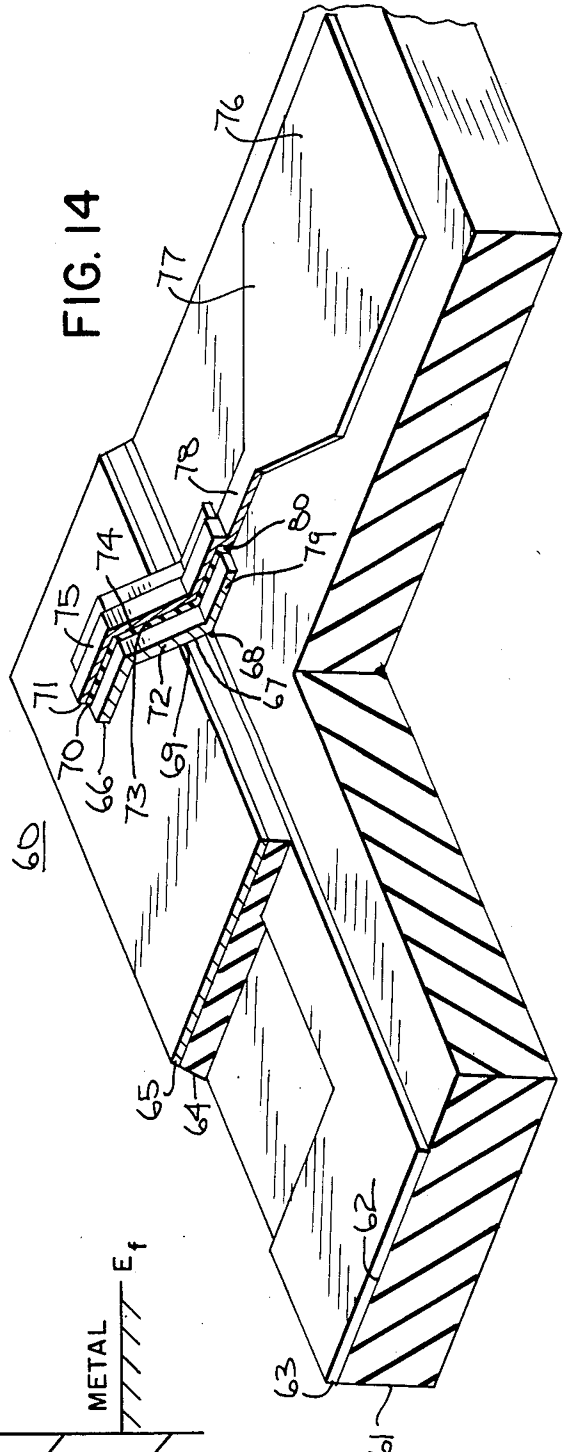
FIG. 14 is a schematic perspective view of MOMS structural geometry in accordance with the invention.
Figure 15:
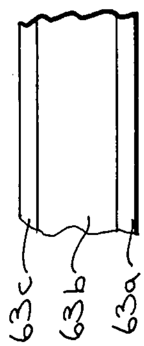
FIG. 15 is a sectional view of a portion of FIG. 14.
Figure 12:
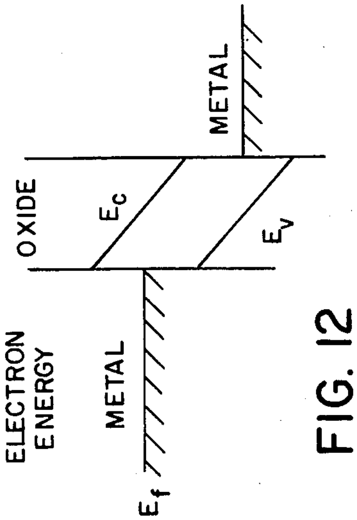
FIG. 12 is a simplified energy band diagram of an MOM tunnel diode.
Figure 13:
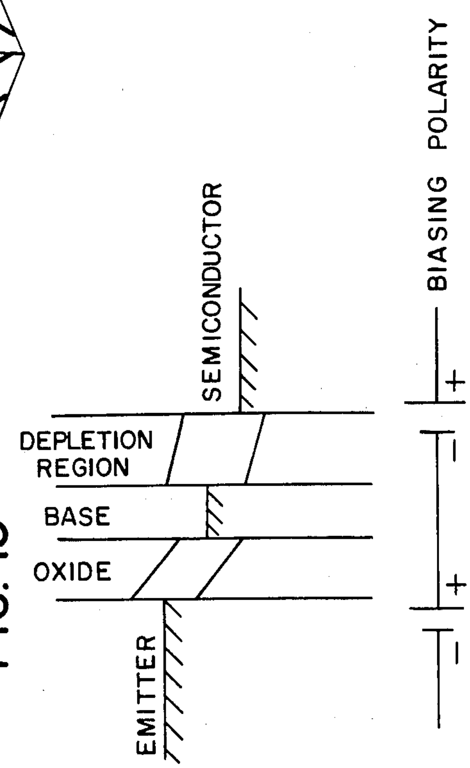
FIG. 13 is a simplified energy band diagram of an MOMS tunnel emission transistor.

FIG. 14 shows an MOMS tunnel effect transistor 60 overcoming the above noted and other problems, and adaptable to monolithic integration with other electro-optic devices, passive as well as active. Transistor 60 is formed on a substrate 61 of electrically insulating material, such as dielectric material (e.g. quartz or the like) or semi-insulating semiconductor material (e.g. silicon, gallium arsenide, etc., doped to a semi-insulating condition). On the upper planar horizontal surface 62 of insulator substrate 61 there is formed a semiconductor layer 63 composed of a highly doped N+ layer **63*b* sandwiched between two gallium arsenide undoped high resistivity layers 63*a* and 63*c*, FIG. 15. On top of layer 63 there is an insulator layer 64 and a metal layer 65 such as gold. A schottky metal 66 is high vacuum deposited and formed on a generally vertical side 67 of a mesa, such as the 111 plane, and contacts edge 68 of N+layer 63 and edge 69 of gold layer 65. The schottky metal 66 is defined in the form of a semi-arch, and its outer surface is oxidized at 70, and metal layer 71** is deposited thereover. The schottky metallurgy can be composed of various combinations of refractory metals, alloys and gold, such as tantalum, molybdenum, molybdenum/silicon, tantalum/silicon, layered tantalum-gold-tantalum, layered molybdenum-gold-molybdenum, layered molybdenum/silicon-gold-molybdenum/silicon, layered tantalum/silicon-gold-tantalum/silicon, and the like.

The device in FIG. 14 is formed by a plurality of mesa stacked horizontal layers including at least one semiconductor layer 63 having an exposed edge 68 at a generally vertical side 67 of the mesa. Schottky metal layer 66 includes a generally vertical portion 72 extending along side 67 of the mesa. Oxide layer 70 has a generally vertical portion 73 on vertical portion 72 of metal layer 66. Metal layer 71 has a generally vertical portion 74 on the oxide layer at 73.

Metal layer 71 extends upwardly at portion 74 beyond the semiconductor layer 63 and then metal layer 65 and then over and spaced above the semiconductor and metal layers at horizontal portion 75 in semi-arch configuration. The mesa stack includes metal layer 65 spaced from semiconductor layer 63 by insulator layer 64. Metal layer 65 has an exposed edge 69 at the side 67 of the mesa electrically metalurgically contacted by the vertical portion 72 of metal layer 66. The schottky junction is formed at edge 68 between semiconductor layer 63 and metal layer 66 at portion 72. Metal layer 66 provides the transistor base. Metal 71 provides one of the emitter and collector of the transistor, and semiconductor 63 provides the other of the emitter and collector. Oxide 70 preferably ranges in thickness from 10 to 40 angstroms. Metal layer 71 has a lower horizontal widended contact pad portion 76 on substrate 61 with a transistion portion 77 to a narrowed section 78 extending along the upper surface 62 of substrate 61 proximate a lower horizontal portion 79 of metal layer 66 on substrate 61 and spaced therefrom by oxide layer 70 at 80.

Figure 16:
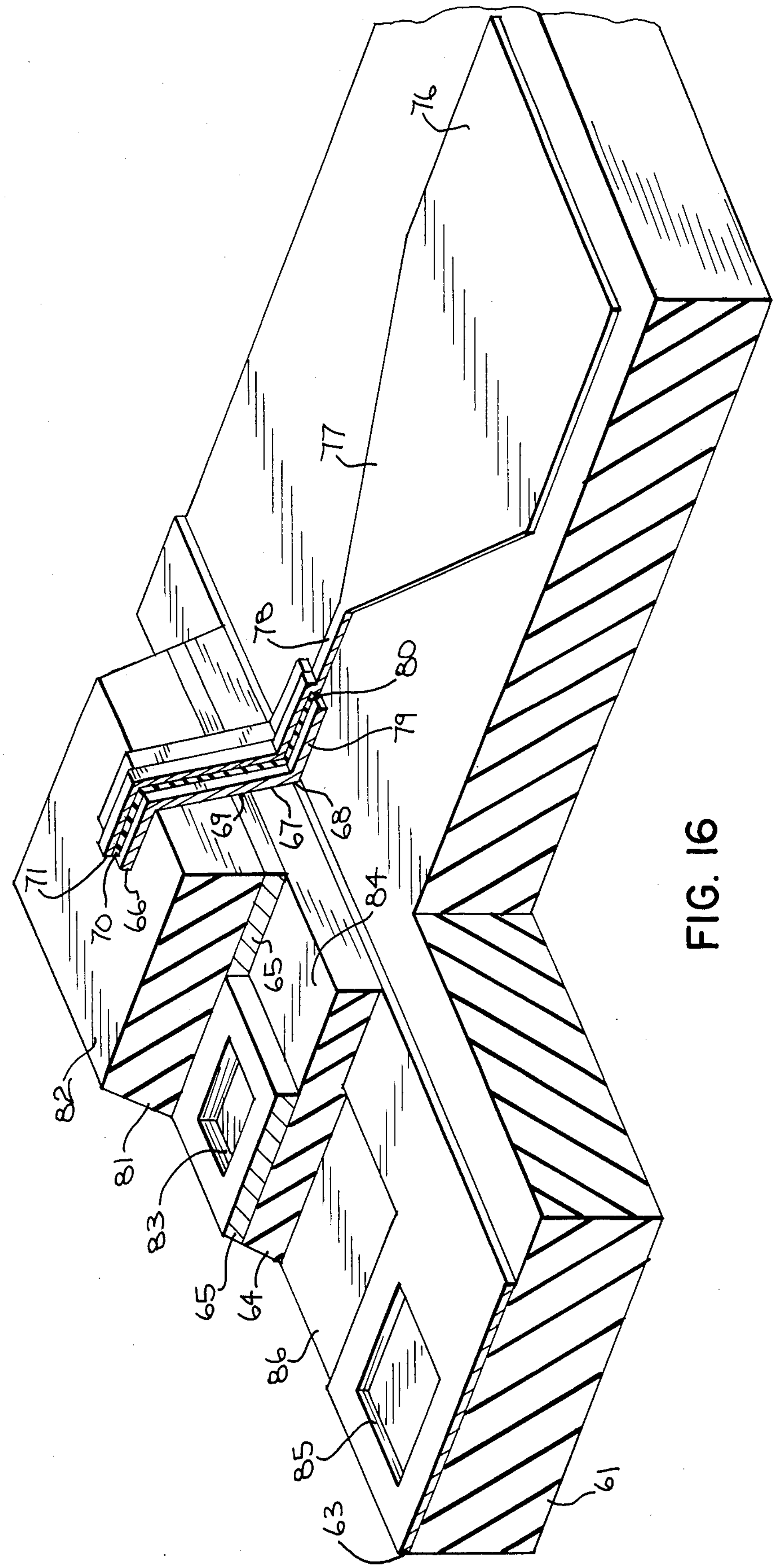
FIG. 16 is a schematic perspective view of a tunnel effect transistor designed to minimize interelectrode or interlayer parasitic coupling capacitance.

Another insulator layer 81, FIG. 16, may be on the upper surface of metal layer 65. Metal layers 66 and 71 and oxide layer 70 extend upwardly along the side 67 of the mesa and then generally horizontally along the upper surface 82 of insulator layer 81 to be spaced above metal layer 65 in a semi-arch configuration.

Semiconductor layer 63 is a highly doped epitaxial layer, such as N++ highly doped gallium arsenide with a carrier concentration ranging from $5\times10^{18}cm^{-3}$ to $5\times10^{19}cm^{-3}$ in the preferred embodiment. Metal layer 65 is preferably gold ranging in thickness from 500 to 5,000 angstroms. Schottky metal layer 66 is preferably one of the following: tantalum; molybdenum; molybdenum/silicon; tantalum/silicon; layered tantalum-gold-tantalum; layered molybdenum-gold-molybdenum; layered molybdenum/silicon-gold-molybdenum/silicon; or layered tantalum/silicon-gold-tantalum/silicon. Metal layer 71 is preferably one of the following: tantalum; molybdenum; tungsten; tantalum/-silicon; molybdenum/silicon; tungsten/silicon; gold; platinum; and palladium. Metal layers 65 and 66 contact each other metallurgically to form an ohmic contact. Semiconductor layer 63 contacts metal layer 66 through the schottky barrier junction at 68.

To reduce the parasitic interelectrode or interlayer capacitance between N+ layer 63 and gold layer 65, the N+ layer can be selectively proton bombarded to convert desirable surface regions to semiinsulating material and additionally or alternatively layer 65 and/or layer 63 can be selectively configured via selective growth or implantation or etching to provide minimum overlap. As shown in FIG. 16, layers 65 and 63 have cutout portions 83–86 which would otherwise overlap sections of the other layer, and thus interlayer capacitance is minimized. The structural geometry of the invention easily enables the layers to be so defined. Top insulator layer 81 may be removed by etching to further reduce parasitic capacitance, with the upper horizontal portions of metal layers 66 and 71 suspended in air.

Upper surface 62 of substrate 61 is covered by sequential and in situ deposition of layers 63*a*, 63*b*, and 63*c*, portions of which may be removed to achieve a desired shape instead of or in addition to the noted cutouts. Layers 64, 65 and 81 are then sequentially deposited. Using reactive plasma dry etching, for example with $CF_4$ or $Ar/O_2$ a mesa is etched to expose the edges of layers 65 and 63 along a generally vertical side 67 of the mesa, such as the 111 plane. Following the mesa definition, schottky metal 66 is deposited as above noted. The lateral width of semi-arch metal 66 can be defined in the 0.5 to 1 micron range.

Following sputter cleaning of the surface of metal 66, in situ oxide layer 70 formation is achieved by reactive deposition or oxidation of the surface of metal 66, followed by deposition of metal layer 71. Using reactive plasma processes, layer 71 is sputter etched in an argon-/oxygen plasma and the collector line width can easily be near or below 0.5 microns. The fabrication of the structure of FIG. 14 is completed by removing the top dielectric layer 81, FIG. 16, if desired. The separation between layers 65 and 63 can be as low as 1,000 angstroms, thus reducing the base resistance to an insignificant low value.

The structural geometry of FIG. 14 provides satisfactory design objectives including extremely small junction area (less than $10^{-10}cm^2$ and high current densities. The parasitic capacitance, inductance and resistance, have been drastically reduced, thus leading to a very high figure of merit that is near or above $10^{12}$ cycles per second. The junction oxide and depletion region have very low barrier potentials as asymmetrical junctions between the emitter/base and base/collector for achieving desirable low input and high output impedance.

In addition to the above described oxidation techniques which include the use of a sputtering etching mode in a plasma ambient containing 5 to 50% oxygen in argon gas and pure reactive deposition from molybdenum, molybdenum/silicon, tantalum, tantalum/silicon, tungsten, and tungsten/silicon, etc., in a pure oxygen plasma ambient, there is another method for forming very thin oxides using the Langmuir-Bladgett film deposition technique to form monomolecular polymer films. The technology of monmolecular film formation is of course well known, however it is now emerging as a promising technology to form highly controllable, very pure polymer films having controllable dielectric and electrical properties as described by G. G. Roberts, "Transducers and Other Applications of Langmuir Bladgett Films", *Sensors and Actuators* 4, 1983, pp. 131–145. These monomolecular films are deposited at room temperature and in a highly pure water bath solution and can provide oxide films having extremely sharp interfaces, controllable thicknesses, desirable electrical and optical properties, crystalline structures, and high field strength. Furthermore, since the characteristics of these monomolecular films can be easily varied by varying the composition of the polymer to achieve desirable electrical and optical properties, they are particularly suitable to the fabrication of tunnel effect transistor devices for the formation of the emitter and collector oxides having the desired barrier potentials.

It is recognized that various alternatives and modifications are possible within the scope of the appended claims. Specific parameters and data have been disclosed for particular structures and technologies and are believed accurate, however the invention is not limited thereby.

I claim:

1. An MOMS semiconductor device comprising:
- a plurality of mesa stacked horizontal layers including at least one semiconductor layer having an exposed edge at a generally vertical side of the mesa;
- a first metal layer having a generally vertical portion extending along said side of said mesa; and
- a generally vertical oxide layer on said vertical portion of said first metal layer; and
- a second metal layer having a generally vertical portion on said oxide layer.

2. The invention according to claim 1 wherein said second metal layer extends upwardly beyond said semiconductor layer and then over and spaced above said semiconductor layer in a semi-arch configuration.

3. The invention according to claim 1 wherein said plurality of mesa stacked layers includes a metal layer spaced from said semiconductor layer by an insulator layer, said mesa stacked metal layer having an exposed edge at said side of said mesa electrically contacted by said vertical portion of said first metal layer.

4. The invention according to claim 3 wherein a schottky junction is formed between said semiconductor layer and said first metal layer.

5. An MOMS tunnel emission transistor of the type having an emitter, a base and a collector, comprising:
- a generally horizontal semiconductor layer;
- a generally horizontal insulator layer on said semiconductor layer;
- a generally horizontal metal layer on said insulator layer;
- said semiconductor layer and said metal layer being stacked as a mesa structure having a generally vertical side exposing the edges of said semiconductor and metal layers;
- a second metal layer having a generally vertical portion extending along said side of said mesa contacting said exposed edges of said semiconductor layer and said first mentioned metal layer;
- a generally vertical oxide layer on said vertical portion of said second metal layer; and
- a third metal layer having a generally vertical portion on said oxide layer.

6. The invention according to claim 5 wherein a schottky junction is formed between said semiconductor layer and said second metal layer.

7. The invention according to claim 6 wherein said second metal layer extends upwardly beyond said first metal layer and over and spaced above said first metal layer in a semi-arch configuration.

8. An MOMS tunnel emission transistor of the type having an emitter, a base and a collector, comprising:
- a substrate having a generally planar horizontal upper surface;
- a semiconductor layer on said upper surface of said substrate, said semiconductor layer being one of the emitter and collector of said transistor;
- an insulator layer on the upper surface of said semiconductor layer;
- a first metal layer on the upper surface of said insulator layer;
- said layers being stacked as a mesa structure having a generally vertical side exposing the edges of said semiconductor layer and said first metal layer;

a second metal layer extending along the upper surface of said substrate adjacent said semiconductor layer and also extending along said side of said mesa contacting said semiconductor layer and said first metal layer, said second metal layer being the base of the transistor;

an oxide layer on said second metal layer; and a third metal layer on said oxide layer, said third metal layer being the other of the emitter and collector of the transistor.

9. The invention according to claim 8 wherein said third metal layer includes a portion extending along the upper surface of said substrate proximate said second metal layer and spaced therefrom by said oxide layer.

10. The invention according to claim 9 comprising a second insulator layer on the upper surface of said first metal layer, and wherein said second and third metal layers and said oxide layer extend along said side of said mesa and then along the upper surface of said second insulator layer to be spaced above said first metal layer in a semi-arch configuration.

11. The invention according to claim 9 wherein said third metal layer has a widened section on said substrate, a narrowed section extending along said oxide layer on said second metal layer, and a transition section extending between said widened and narrowed sections.

12. The invention according to claim 8 wherein said semiconductor layer is a highly doped N+ epitaxial layer.

13. The invention according to claim 12 wherein said semiconductor layer is an N++ highly doped gallium arsenide epitaxial layer with carrier concentration ranging from $5\times10^{18}cm^{-3}$ to $5\times10^{19}cm^{-3}$, and said first metal layer is gold ranging in thickness from 500 to 5,000 angstroms, and said oxide layer ranges in thickness from 10 to 40 angstroms.

14. The invention according to claim 13 wherein said second metal layer is selected from the group consisting of: tantalum; molybdenum; molybdenum/silicon; tantalum/silicon; layered tantalum-gold-tantalum; layered molybdenum-gold-molybdenum; layered molybdenum/silicon-gold-molybdenum/silicon; and layered tantalum/silicon-gold-tantalum/silicon.

15. The invention according to claim 14 wherein said third metal layer is selected from the group consisting of tantalum, molybdenum, tungsten, tantalum/silicon, molybdenum/silicon, tungsten/silicon, gold, platinum and palladium.

16. The invention according to claim 8 wherein said first metal layer and said second metal layer contact metalurgically, and wherein said semiconductor layer and said second metal layer contact through a schottky barrier junction.

17. The invention according to claim 8 wherein said semiconductor and first metal layers have cut-out portions otherwise overlapping sections of the other layer, whereby to minimize interlayer capacitance.

18. The invention according to claim 8 wherein said third metal layer extends along said side of said mesa and beyond said first metal layer and then over and spaced above said first metal layer in a semi-arch configuration suspended in air.

* * * * *